(12) United States Patent
Huang et al.

(10) Patent No.: US 11,902,401 B2
(45) Date of Patent: Feb. 13, 2024

(54) DATA COMPRESSION METHOD AND BASE STATION

(71) Applicant: HUAWEI TECHNOLOGIES CO., LTD., Guangdong (CN)

(72) Inventors: Qufang Huang, Shenzhen (CN); Qiang Fan, Hefei (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 222 days.

(21) Appl. No.: 17/389,786

(22) Filed: Jul. 30, 2021

(65) Prior Publication Data

US 2021/0360089 A1  Nov. 18, 2021

Related U.S. Application Data

(63) Continuation of application No. PCT/CN2020/072885, filed on Jan. 17, 2020.

(30) Foreign Application Priority Data

Jan. 31, 2019  (CN) .......................... 201910099660.2

(51) Int. Cl.
*H04L 29/06* (2006.01)
*H04L 69/04* (2022.01)
(52) U.S. Cl.
CPC .................................... *H04L 69/04* (2013.01)
(58) Field of Classification Search
CPC .... H04L 69/04; H04L 67/568; H03M 7/4062; H03M 7/6052; H03M 7/3088; H04W 24/10
See application file for complete search history.

(56) References Cited

U.S. PATENT DOCUMENTS

| 8,502,707 B2 * | 8/2013 | Fallon ................. H03M 7/4006 |
| | | 341/51 |
| 8,786,471 B1 | 7/2014 | Shirguppi |
| 8,885,477 B2 * | 11/2014 | Evans ................. H03M 7/3066 |
| | | 370/468 |

(Continued)

FOREIGN PATENT DOCUMENTS

| CN | 1475047 A | 2/2004 |
| CN | 101729075 A | 6/2010 |

(Continued)

OTHER PUBLICATIONS

CATT, "Cross check on APDC," 3GPP TSG-RAN WG2 #99, R2-1708360, Berlin, Germany, Aug. 21-25, 2017, 3 pages.

(Continued)

*Primary Examiner* — Jay P Patel
(74) *Attorney, Agent, or Firm* — Fish & Richardson P.C.

(57) ABSTRACT

Embodiments of this application disclose example data compression methods and example base stations. One example method includes obtaining, by a base station, identification information of at least one of a data compression device or a data decompression device. A dictionary can then be generated based on the identification information. The dictionary can then be sent to the data compression device and the data decompression device to enable the data compression device and the data decompression device to perform data compression and data transmission based on the dictionary.

20 Claims, 6 Drawing Sheets

(56) References Cited

U.S. PATENT DOCUMENTS

| | | | | |
|---|---|---|---|---|
| 9,729,215 | B2* | 8/2017 | Rahman | H04B 7/0456 |
| 10,638,347 | B2* | 4/2020 | Tian | H04L 1/1854 |
| 11,166,189 | B2* | 11/2021 | Xu | H04W 80/08 |
| 11,202,227 | B2* | 12/2021 | Liu | H04L 1/1835 |
| 11,445,404 | B2* | 9/2022 | Kim | H04L 69/22 |
| 2002/0103938 | A1* | 8/2002 | Brooks | H03M 7/3088 |
| | | | | 709/247 |
| 2010/0329282 | A1* | 12/2010 | Guo | H03M 7/30 |
| | | | | 370/477 |
| 2011/0145313 | A1 | 6/2011 | Narayanan et al. | |
| 2013/0086339 | A1 | 4/2013 | Pardo et al. | |
| 2015/0046127 | A1* | 2/2015 | Chen | G05B 23/0221 |
| | | | | 702/189 |
| 2015/0372728 | A1* | 12/2015 | Rahman | H04L 5/0007 |
| | | | | 370/329 |
| 2016/0226511 | A1* | 8/2016 | Kataoka | H03M 7/3084 |
| 2019/0028920 | A1* | 1/2019 | Pan | H04L 47/24 |
| 2019/0116521 | A1* | 4/2019 | Qiao | H04L 69/04 |
| 2019/0349810 | A1* | 11/2019 | Cho | H04W 28/06 |
| 2019/0364541 | A1* | 11/2019 | Ryu | H04W 80/10 |
| 2020/0008118 | A1* | 1/2020 | Han | H04W 68/005 |
| 2020/0053590 | A1* | 2/2020 | Xu | H04W 28/0268 |
| 2020/0259896 | A1* | 8/2020 | Sachs | H04J 3/0667 |
| 2020/0396640 | A1* | 12/2020 | Quan | H04L 69/04 |
| 2021/0250850 | A1* | 8/2021 | Huang | H04W 48/08 |

FOREIGN PATENT DOCUMENTS

| | | | | |
|---|---|---|---|---|
| CN | 102122960 | A | 7/2011 | |
| CN | 103281156 | A | 9/2013 | |
| CN | 103326732 | A | 9/2013 | |
| CN | 107240247 | A | 10/2017 | |
| CN | 107302585 | A | 10/2017 | |
| CN | 108092956 | A | 5/2018 | |
| CN | 109039811 | A | 12/2018 | |
| CN | 109246169 | A | 1/2019 | |
| WO | 2007025410 | A1 | 3/2007 | |
| WO | WO-2014092895 | A1 * | 6/2014 | ........... H04L 65/601 |
| WO | WO-2016009254 | A1 * | 1/2016 | ........... H03M 7/6082 |
| WO | WO-2019098750 | A1 * | 5/2019 | ........... H04L 1/0061 |

OTHER PUBLICATIONS

CATT, "More Details and Simulation Results of Deflate with 1 Byte UDC Header," 3GPP TSG-RAN WG2 #99, R2-1708358, Berlin, Germany, Aug. 21-25, 2017, 7 pages.

Deutsch, "DEFLATE Compressed Data Format Specification version 1.3," Network Working Group, RFC 1951, May 1996, 15 pages.

Deutsch et al., "ZLIB Compressed Data Format Specification version 3.3," Network Working Group, RFC 1950, May 1996, 10 pages.

Guannan, "Research on an Improved LZW Data Compression Algorithm Based on Cloud Storage," Bulletin of Science and Technology, vol. 33, No. 7, Jul. 2017, 4 pages.

Office Action issued in Chinese Application No. 201910099660.2 dated Jan. 14, 2021, 7 pages (with English translation).

PCT International Search Report and Written Opinion issued in International Application No. PCT/CN2020/072885 dated Apr. 14, 2020, 16 pages (with English translation).

Qualcomm, Sprint, "Comparison of UDC candidate solutions under agreed metrics," 3GPP TSG-RAN WG2 Meeting #98, R2-1705614, Hangzhou, China, May 15-19, 2017, 8 pages.

Qualcomm Incorporated, "Comparison Study on Deflate and APDC," 3GPP TSG-RAN WG2 Meeting #99, R2-1708979, Berlin, Germany, Aug. 21-25, 2017, 7 pages.

Qualcomm Incorporated, "A Quantitative Evaluation on APDC Processing Complexity," 3GPP TSG-RAN WG2 Meeting #99, R2-1709842, Berlin, Germany, Aug. 21-25, 2017, 4 pages.

See, "A Template for IETF Patent Disclosures and Licensing Declarations," Network Working Group, RFC 3905, Sep. 2004, 9 pages.

SoftBank, "Further analysis on APDC solution," 3GPP TSG RAN WG2 Meeting #99, R2-1708572, Berlin, Germany, Aug. 21-25, 2017, 4 pages.

Zhenlong et al., "Improvement of Entropy Reduction for LZW Compression Algorithm Based On Big Dictionary," Computer Applications and Software, vol. 33, No. 6, Jun. 2016, 4 pages.

* cited by examiner

DATA COMPRESSION METHOD AND BASE STATION

CROSS-REFERENCE TO RELATED APPLICATIONS

This application is a continuation of International Application No. PCT/CN2020/072885, filed on Jan. 17, 2020, which claims priority to Chinese Patent Application No. 201910099660.2, filed on Jan. 31, 2019. The disclosures of the aforementioned applications are hereby incorporated by reference in their entireties.

TECHNICAL FIELD

This application relates to the field of industrial control and the field of communications technologies and, in particular, to a data compression method and a base station.

BACKGROUND

In an existing wireless communications system, a data packet accesses an external network by using user equipment (UE for short)-a base station-a user plane function (UPF for short) entity, and needs to pass through a relatively large quantity of nodes, and a delay is relatively large. Therefore, in industrial control, an architecture in which a control node sinks is introduced, and a programmable logic controller (PLC for short) used as an industrial control node is placed inside a radio access network (RAN for short). In this way, the base station may determine a service type to determine an egress of the data packet. For downlink, the base station receives industrial control data from the PLC and transmits the data to the UE. The base station receives data of another service from the UPF and transmits the data to the UE. For uplink, after receiving data from the UE, the base station determines a service type of the UE. If the data is industrial-control-related data, the base station routes the data to the PLC. If the data is service-related data of another type, the base station routes the data to the UPF. In a data packet transmission process, each network element may add a data packet header to a data packet for a purpose such as routing control or segmentation and reassembly. Therefore, when the data packet arrives at an air interface, the data packet may carry some data packet headers. To reduce an amount of data transmitted over the air interface, compression of the data packet transmitted over the air interface, including compression of the data packet headers and compression of the data packet itself, needs to be performed.

In an existing wireless communication system, a manner of uplink data compression (UDC for short) is introduced for processing uplink data. By using the UDC, the data packet headers may be compressed together with the data packet itself. The base station first configures a predefined dictionary for a data radio bearer (DRB for short). Currently, there are two types of dictionaries: a session initiation protocol (SIP) type or an operator-customized type. A UE side pre-stores a corresponding data block in a local buffer of the UE side based on a predefined dictionary, and a base station side also stores the same data block in a local buffer of the base station side. When a user data packet arrives, the UE compares the received data packet with content stored in the local buffer to determine content that can be compressed, compresses the data packet, updates the local buffer, and sends the compressed data packet to the base station. After receiving the data packet, the base station restores, based on content in the local buffer of the base station, the data packet to a status before the compression, and updates the content in the local buffer of the base station. This manner requires a predefined dictionary. However, in an industrial private network, a data transmission link changes, and the existing UDC manner cannot be used to compress a data packet.

SUMMARY

A technical problem to be resolved in embodiments of this application is to provide a data compression method and a base station to resolve a problem that a data packet cannot be compressed in a manner of using a UDC in an industrial private network.

According to a first aspect, an embodiment of this application provides a data compression method, and the method may include:

obtaining, by a base station, identification information of a data compression device and/or a data decompression device;

generating a dictionary based on the identification information; and sending the dictionary to the data compression device and the data decompression device to enable the data compression device and the data decompression device to perform data compression and data transmission based on the received dictionary.

In a possible implementation, after the sending the dictionary to the data compression device and the data decompression device, the method further includes:

sending the dictionary to a third-party control device for storage; and when the base station is powered off and then powered on again, obtain the dictionary from the third-party control device.

In a possible implementation, before the obtaining, by a base station, identification information of a data compression device and/or a data decompression device, the method further includes:

receiving, by the base station, a service start message sent by the data decompression device or a third-party control device, and determining a to-be-used data compression algorithm based on a type of a data packet header indicated by the service start message, where the data compression algorithm includes an algorithm that is based on uplink data transmission UDC.

In a possible implementation, the type of the data packet header is identified by using a data bearer as a granularity and/or identified by using a flow flow as a granularity.

If the type of the data packet header is identified by using the data bearer as the granularity, the type of the data packet header includes any one of the following: an IP address combined with an Ethernet address, unstructured data combined with an Ethernet address, or an explicitly indicated data compression algorithm.

If the type of the data packet header is identified by using the flow flow as the granularity, the type of the data packet header includes any one of the following: an IP address, an Ethernet address, an IP address combined with an Ethernet address, unstructured data combined with an Ethernet address, or an explicitly indicated data compression algorithm.

In a possible implementation, the method further includes:

for a periodic service, indicating, by the base station, the data compression device to store a to-be-stored data packet that needs to be stored in a memory in one cycle to enable the data compression device to store the to-be-stored data packet in the memory when sending all data packets in the cycle; and performing, by the data decompression device, a check after receiving all the data packets sent in the cycle and storing the to-be-stored data packet in the memory when the check succeeds.

In a possible implementation, for a periodic service, when one or more cycles end, the data decompression device sends a feedback status report to the data compression device based on a result of data packet receiving; and notifies the data compression device to retransmit a lost data packet or notifies the data compression device to move the lost data packet out of the memory to ensure that UDC buffers in memories of the data decompression device and the data compression device are the same.

In a possible implementation, the identification information includes at least one of the following:

an Ethernet address, an IP address, port information, or a virtual local area network identifier.

In a possible implementation, the identification information further includes an application layer command sent by the data decompression device to the data compression device.

According to a second aspect, an embodiment of this application provides a base station. The base station may include:

a transceiver unit, configured to obtain identification information of a data compression device and/or a data decompression device; and a processing unit, configured to generate a dictionary based on the identification information, where the processing unit is further configured to: send the dictionary to the data compression device and the data decompression device to enable the data compression device and the data decompression device to perform data compression and data transmission based on the received dictionary.

In a possible implementation, the transceiver unit is further configured to:

send the dictionary to a third-party control device for storage; and when the base station is powered off and then powered on again, obtain the dictionary from the third-party control device.

In a possible implementation, the transceiver unit is further configured to:

receive a service start message sent by the data decompression device or a third-party control device; and the processing unit is further configured to:

determine a to-be-used data compression algorithm based on a type of a data packet header indicated by the service start message, where the data compression algorithm includes an algorithm that is based on uplink data transmission UDC.

In a possible implementation, the type of the data packet header is identified by using a data bearer as a granularity and/or identified by using a flow flow as a granularity.

If the type of the data packet header is identified by using the data bearer as the granularity, the type of the data packet header includes any one of the following: an IP address combined with an Ethernet address, unstructured data combined with an Ethernet address, or an explicitly indicated data compression algorithm.

If the type of the data packet header is identified by using the flow flow as the granularity, the type of the data packet header includes any one of the following: an IP address, an Ethernet address, an IP address combined with an Ethernet address, unstructured data combined with an Ethernet address, or an explicitly indicated data compression algorithm.

In a possible implementation, for a periodic service, the transceiver unit is further configured to: indicate the data compression device to store a to-be-stored data packet that needs to be stored in a memory in one cycle to the data compression device to store the to-be-stored data packet in the memory when sending all data packets in the cycle; and perform a check after receiving all the data packets sent in the cycle, and store the to-be-stored data packet in the memory when the check succeeds.

In a possible implementation, for a periodic service, when one or more cycles end, the data decompression device sends a feedback status report to the data compression device based on a result of data packet receiving; and notifies the data compression device to retransmit a lost data packet or notifies the data compression device to move the lost data packet out of the memory to ensure that UDC buffers in memories of the data decompression device and the data compression device are the same.

In a possible implementation, the identification information includes at least one of the following:

an Ethernet address, an IP address, port information, or a virtual local area network identifier.

In a possible implementation, the identification information further includes an application layer command sent by the data decompression device to the data compression device.

According to a third aspect, an embodiment of this application provides a base station. The base station may include:

a processor, a memory, and a bus, where the processor and the memory are connected through the bus, the memory is configured to store a group of program code, and the processor is configured to invoke the program code stored in the memory to perform the step in any one of the first aspect or the implementations of the first aspect of the embodiments of this application.

According to a fourth aspect, an embodiment of this application provides a computer-readable storage medium. The computer-readable storage medium stores instructions. When the instructions are run on a computer, the method in the first aspect or any implementation of the first aspect is implemented.

BRIEF DESCRIPTION OF DRAWINGS

To describe technical solutions in embodiments of this application or in the background more clearly, the following briefly describes accompanying drawings used for describing the embodiments of this application or the background.

DESCRIPTION OF EMBODIMENTS

The following describes embodiments of this application with reference to accompanying drawings in some embodiments of this application.

Terms "including", "including", or any other variant thereof mentioned in the specification, claims, and the accompanying drawings of this application, are intended to cover a non-exclusive inclusion. For example, a process, a method, a system, a product, or a device that includes a series of steps or units is not limited to the listed steps or units, but optionally further includes an unlisted step or unit, or optionally further includes another inherent step or unit of the process, the method, the product, or the device.

The term "and/or" in this application describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

Figure 1:
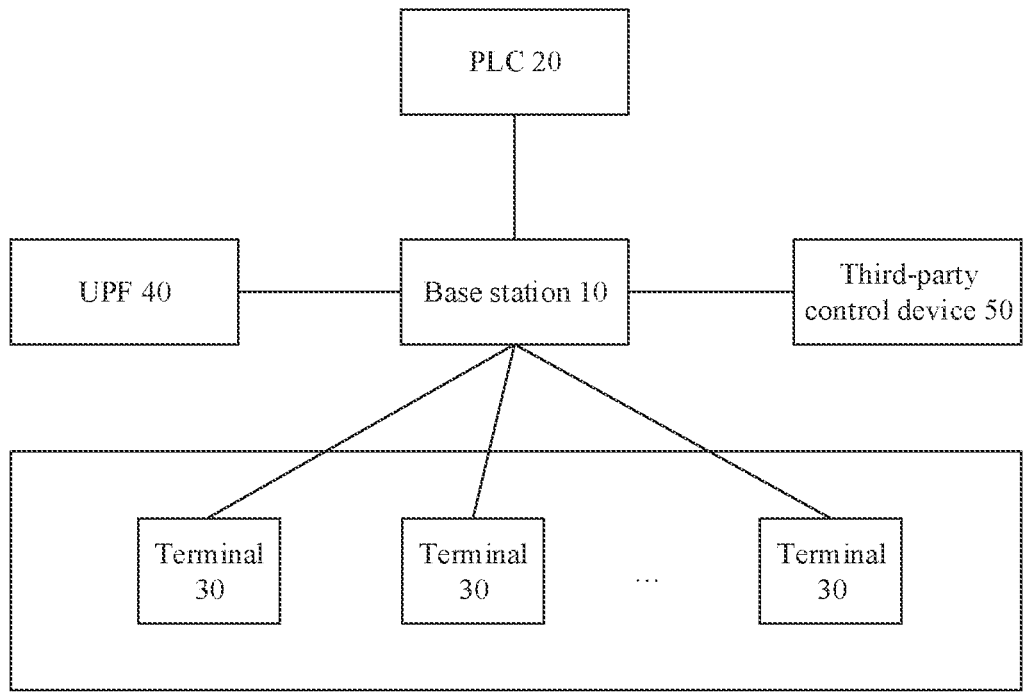
FIG. 1 is a schematic diagram of an industrial private network architecture according to an embodiment of this application.
Figure 2:
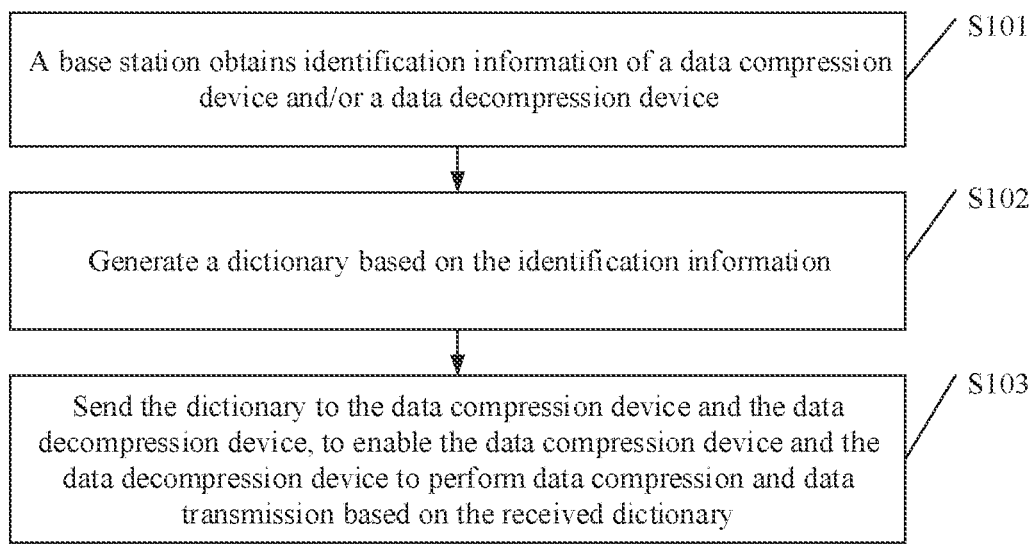
FIG. 2 is a schematic flowchart of a data compression method according to an embodiment of this application.

FIG. 1 is a schematic architectural diagram of an industrial private network according to an embodiment of this application. In the architecture shown in FIG. 1, a gNB 10, a PLC 20, a terminal 30 (an operation arm), a UPF 40, an access and mobility management function (AMF) entity (not shown in the figure), a session management function (SMF for short) entity (not shown in the figure), a third-party control device 50, and the like are included.

UE may also be referred to as a terminal, a user terminal, a terminal device, or the like, and may be presented in a common form of an operation arm in industrial control. The base station may determine a service type, and determine an egress of a data packet. For downlink, the base station may receive industrial control data from the PLC and transmit the data to the UE. The base station receives data of another service from the UPF and transmits the data to the UE. For uplink, after receiving data from the UE, the base station determines a service type of the UE. If the data is industrial-controlled, the base station routes the data to the PLC. If the data is data of another type, the base station routes the data to the UPF.

The SMF and the AMF are control plane network nodes. The AMF is responsible for mobility management and is connected to the operating arm. The SMF manages sessions and connects to the AMF. The third-party control device can be used for global control and connects to the base station.

The third-party control device 50 is a network element device on a network side, and may also be referred to as a control center, a control server, a third-party device, or the like. The third-party control device 50 may be configured to store configuration information such as a dictionary or other configuration data and may be further configured to generate a control instruction and send the control instruction to the base station 10 or the terminal 30 to control the base station 10 or the terminal 30. The third-party control device 50 may be integrated and disposed with an existing industrial private network system, or may be disposed independently of an existing industrial private network system in an external manner. This is not limited in this embodiment of this application.

In this embodiment of this application, the base station/PLC/third-party control device may collect an Ethernet address of the UE and/or the PLC to generate a dictionary used for the UDC so that the UDC is used to compress a data packet in the industrial private network. This reducing link resource consumption, and improves data transmission efficiency.

It should be noted that although a manner of UDC is used for description in this application, in this embodiment of this application, not only an uplink data packet may be compressed in a manner of UDC, but a downlink data packet may also be compressed in a similar manner. When uplink data is transmitted, the terminal is a data compression device, and the PLC is a data decompression device. In addition, according to a transmission path of the data, the base station or the node device on the network side may also be a data decompression device. When downlink data is transmitted, the PLC is a data compression device, and the terminal is a data decompression device. In addition, according to a transmission path of the data, the base station or the node device on the network side may also be a data compression device.

FIG. 1 is a schematic flowchart of a data compression method according to an embodiment of this application, and the method specifically includes the following steps:

S101. A base station obtains identification information of a data compression device and/or a data decompression device.

S102. Generate a dictionary based on the identification information.

S103. Send the dictionary to the data compression device and the data decompression device to enable the data compression device and the data decompression device to perform data compression and data transmission based on the received dictionary.

Referring to the foregoing description, based on differentiation of uplink or downlink, a device entity corresponding to the data compression device and a device entity corresponding to the data decompression device are different.

When generating the dictionary, the base station may obtain only the identification information of the data compression device, or may obtain only the identification information of the data decompression device, or may obtain both the identification information of the data compression device and the identification information of the data decompression device. This is not limited in this embodiment of this application.

Optionally, the identification information may include at least one of the following: an Ethernet address, an IP address, port information, or a virtual local area network identifier.

In addition to the foregoing static identification information, dynamic identification information, such as an application layer command sent by the data decompression device to the data compression device, may be obtained according to different production tasks to generate a dictionary or update a dictionary.

For ease of description and explanation, in the following embodiments of this application, the base station collects identification information such as an Ethernet address of each device and generates a dictionary, and the terminal describes uplink data packet compression. In this case, the terminal is a data compression device, and the PLC is a data decompression device. The PLC/third-party control device collects the Ethernet address and generates the dictionary. A method for compressing downlink data packet by the PLC and the terminal is similar, and details are not described again.

The following describes in detail data compression methods in this application with reference to FIG. 3 to FIG. 6.

Figure 3:
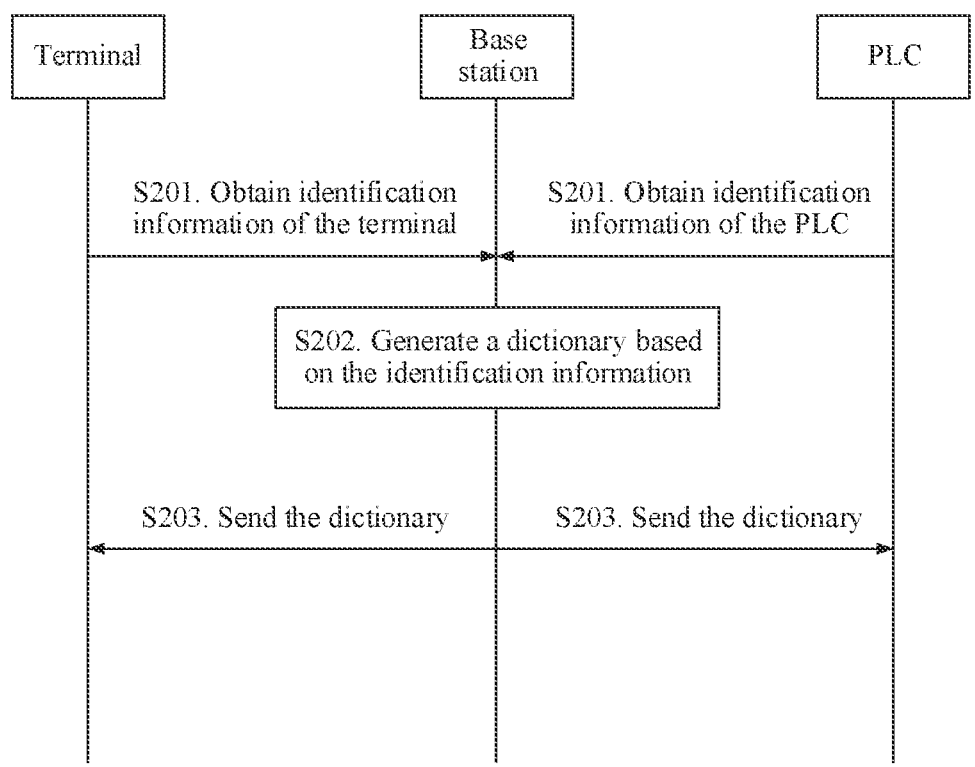
FIG. 3 is a schematic flowchart of another data compression method according to an embodiment of this application.

FIG. 3 is a schematic flowchart of another data compression method according to an embodiment of this application, and the method specifically includes the following steps:

S201. A base station obtains an Ethernet address of a terminal and an Ethernet address of a programmable logic controller PLC.

S202. Generate a dictionary based on the information.

S203. Send the dictionary to the terminal and the PLC so that the terminal and the PLC perform data compression and data transmission based on the received dictionary.

In this embodiment, after the device is powered on, the PLC and the terminal may notify the base station of their Ethernet addresses. After receiving the Ethernet addresses, the base station may generate a common dictionary used for UDC, and then send the dictionary to the terminal and the PLC. The terminal and the PLC store the dictionary in their local buffers. This implements compression for data packet transmission between the terminal and the PLC. Each terminal and each PLC use a same dictionary, and each time a data packet is received thereafter, each terminal and each PLC update the dictionary.

Optionally, in addition to the Ethernet addresses, at least one of a virtual local area network (VLAN for short) identifier, port information, an IP address, or other information may be further reported.

Optionally, the dictionary may alternatively include a first dictionary used by the terminal and a second dictionary used by the PLC, instead of the common dictionary.

The first dictionary is different from the second dictionary.

Actually, an air interface status between the terminal and the base station and an air interface status between the base station and the PLC may be greatly different. For this difference, the base station may generate one dictionary for all terminals, and one dictionary for the PLC.

Optionally, a quantity of terminals is greater than or equal to one. When the quantity of terminals is greater than one, the base station may generate an independent dictionary for each terminal. Alternatively, the base station generates an independent dictionary for terminals in a same workgroup.

Certainly, a dictionary may alternatively be generated by a third-party control device instead of the base station. For example, after collecting the Ethernet addresses of the terminal and the PLC, the base station may send a list of Ethernet addresses of all devices to the third-party control device, and the third-party control device generates the dictionary and sends the dictionary to the base station, and then the base station distributes the dictionary to the terminal and the PLC. Alternatively, the PLC may receive an Ethernet address list sent by the base station to generate the dictionary, or directly collect Ethernet addresses to generate the dictionary. Details are not described herein again.

It should be noted that, in an industrial private network, a plurality of terminals may form a working group or an operation group that is centrally managed and controlled by the PLC. Therefore, when reporting the Ethernet address to the base station, the terminal may alternatively report the Ethernet address in a manner of "a group identifier (group ID) combined with the Ethernet address". In this way, when generating the dictionary, the base station may generate a dictionary for each group.

In this embodiment of this application, the Ethernet addresses of the terminal and the PLC are obtained to generate the dictionary used for UDC so that an existing SIP-type dictionary or an operator-customized dictionary does not need to be used. Therefore, the terminal and the PLC may use a UDC-based compression algorithm to perform data compression in the industrial private network. This improves compression efficiency and a compression effect of the system, reduces usage of uplink and downlink communication resources, facilitates fast service execution, and improves industrial productivity.

Figure 4:
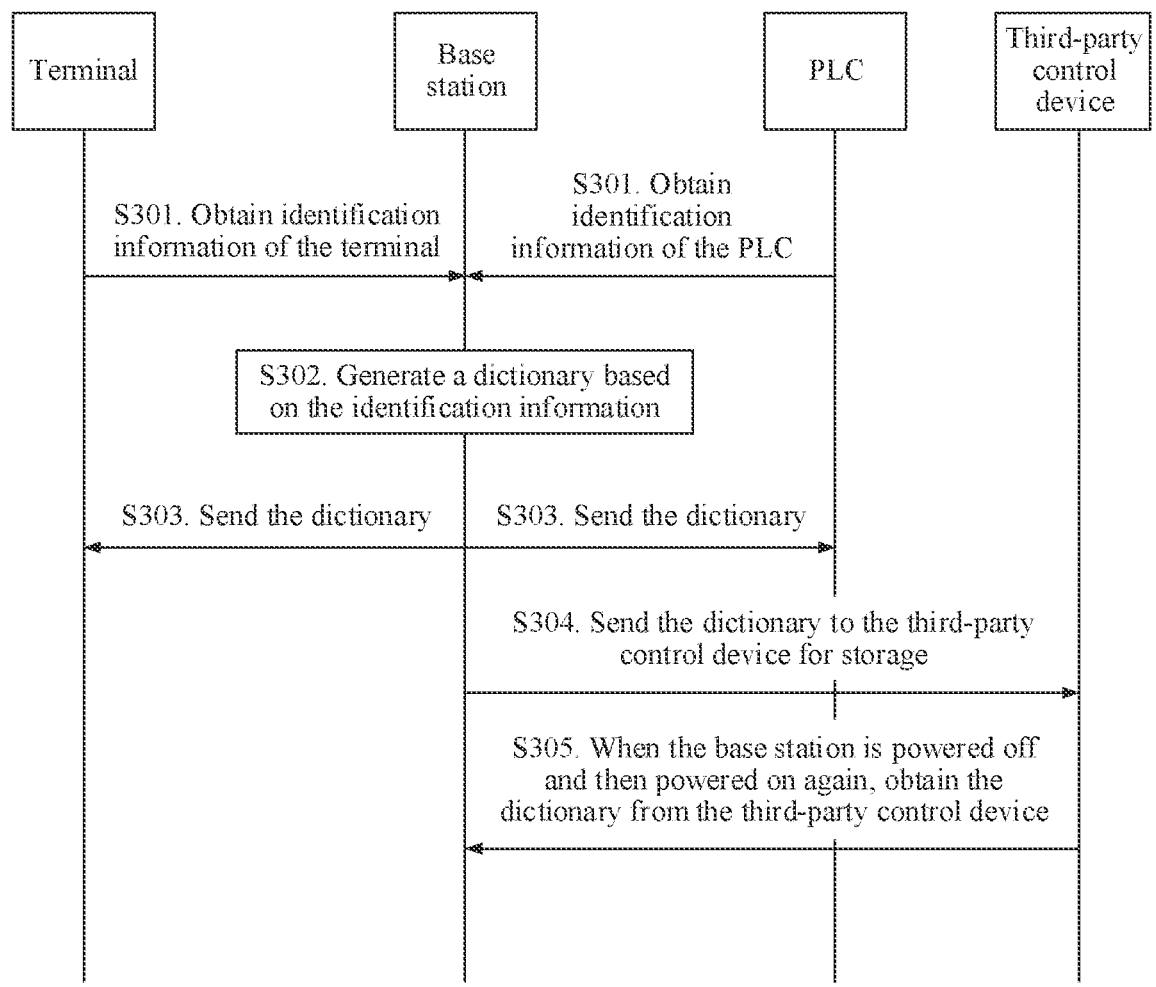
FIG. 4 is a schematic flowchart of yet another data compression method according to an embodiment of this application.

FIG. 4 is a schematic flowchart of still another data compression method according to an embodiment of this application. In this embodiment, steps S301 to S303 are the same as steps S201 to S203, and after step S203, the method further includes:

S304. Send the dictionary to a third-party control device for storage.

S305. When the base station is powered off and then powered on again, obtain the dictionary from the third-party control device.

During initial power-on, the base station may collect Ethernet addresses of each terminal and each PLC to generate the dictionary, and may report the dictionary to the third-party control device for storage. After next power-on, the third-party control device directly sends the dictionary to the base station, and then the base station sends the dictionary to each terminal and each PLC. In this way, system efficiency is improved.

Optionally, if an independent dictionary is generated for each terminal, the base station may send a terminal identifier or a base station identifier to obtain the dictionary reported by the base station. If an independent dictionary is generated for terminals in a same workgroup, the base station may send a group identifier or a base station identifier to obtain the dictionary reported by the base station. If a common dictionary is generated for all devices, the base station may send the base station identifier to obtain the dictionary reported by the base station.

The dictionary is reported to the third-party control device so that during next power-on, the Ethernet addresses do not need to be collected again to generate the dictionary. This improves system work efficiency.

Similar to power-on and power-off, when a production task needs to be changed, the dictionary may also be reported to the third-party control device, and then the dictionary is obtained from the third-party control device. Certainly, if the dictionary includes not only static information such as an Ethernet address, but also information such as an application layer command sent by the PLC, a new dictionary may be generated again because application layer commands corresponding to different production tasks are usually different. The application layer command is used to instruct, according to a requirement of the production task, the terminal to perform an operation indicated by the application layer command. For example, the PLC notifies the terminal to "move up by 10 cm", "turn left by 15 degrees", "turn clockwise by 180 degrees", and the like.

It should be noted that, in a data sending process, the dictionary may be static/semi-static. If the dictionary is static, the dictionary does not need to be updated in a data packet transmission process. If the dictionary is semi-static, the dictionary can be updated only using explicit signaling. For example, after the first production task on a production line is completed, the dictionary is updated using explicit signaling, and the second production task is started. A static/semi-static/dynamic dictionary is configured by a network side device, for example, by a base station or by a PLC. The static or semi-static dictionary is mainly used to limit a dictionary update manner. For a dictionary source, the static or semi-static dictionary may be generated through negotiation between two parties of data compression and decompression, or may be provided by another node, such as a third-party control device or a database manually configured in the background. This is not limited in this application.

Figure 5:
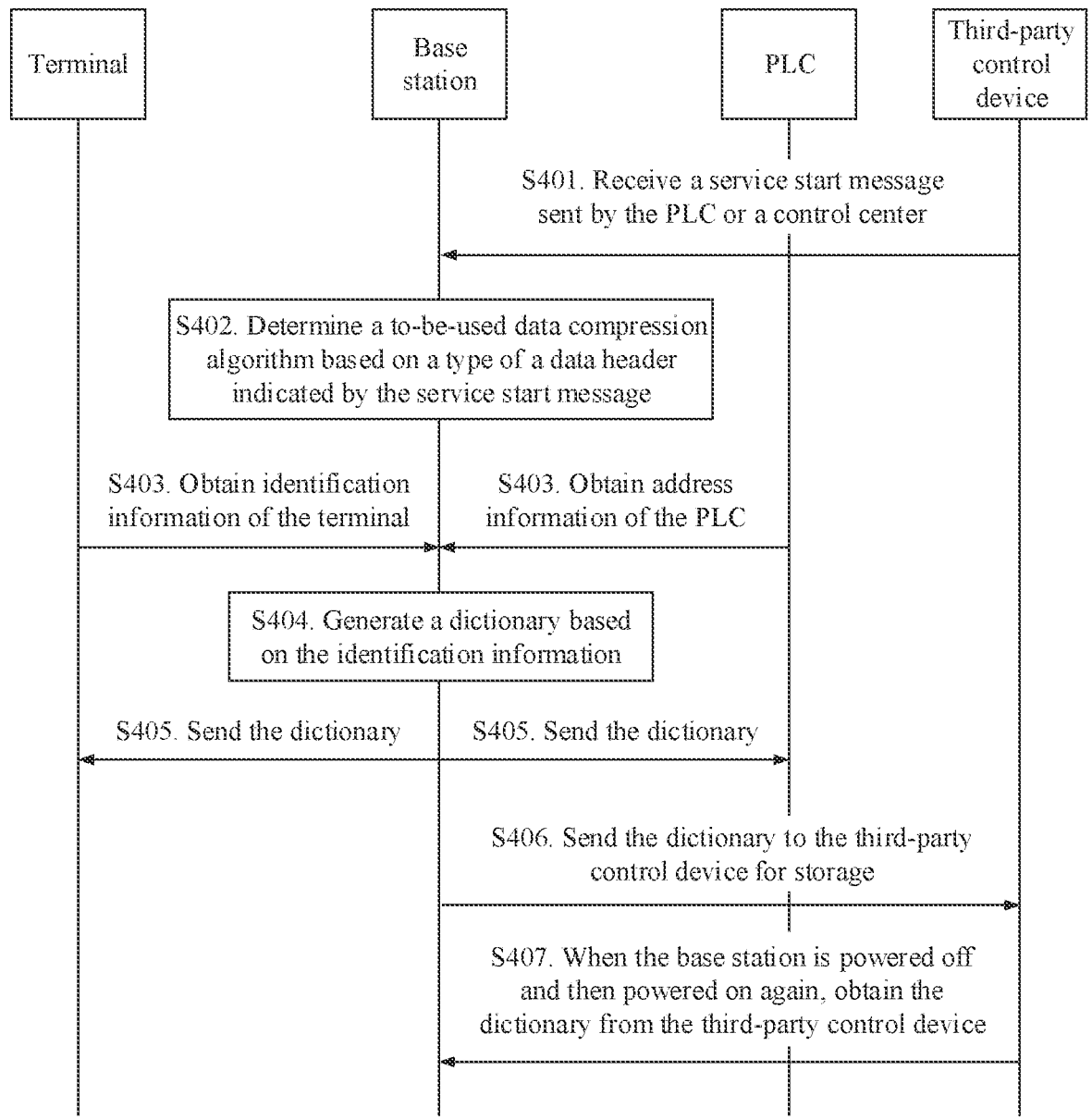
FIG. 5 is a schematic flowchart of yet another data compression method according to an embodiment of this application.

FIG. 5 is a schematic flowchart of still another data compression method according to an embodiment of this application. In this embodiment, steps S403 to S407 are the same as steps S301 to S305, and before step S403, the method may include the following steps.

S401. A base station receives a service start message sent by a PLC or a third-party control device.

S402. Determine a to-be-used data compression algorithm based on a type of a data packet header indicated by the service start message, where the data compression algorithm includes an algorithm that is based on uplink data transmission UDC.

Before a service starts, when initiating the service start message to the base station, that is, when configuring a session, the third-party control device or the PLC may indicate a type of a data packet header of the session to the base station. After receiving the indication, the base station may configure, based on the indication, a compression algorithm used by the service, such as a common ROHC algorithm or a UDC-based algorithm. In an industrial private network, an Ethernet packet header is added to a format of a data packet header. Therefore, an existing ROHC algorithm that is based on the ROHC protocol cannot be used to perform compression. Therefore, during session configuration, it may be indicated that the ROHC algorithm is no longer configured for the service and the UDC-based algorithm is used. The UDC-based algorithm may be various algorithms such as ZLib, Deflate, and adaptive packet data compression (APDC for short). Compression may be performed based on a compression manner of UDC, which may also be referred to as a compression manner using a network characteristic. This is not limited in this embodiment of this application.

Optionally, the type of the data packet header is identified by using a data bearer as a granularity and/or identified by using a flow flow as a granularity.

If the type of the data packet header is identified by using the data bearer as the granularity, the type of the data packet header includes any one of the following: an IP address combined with an Ethernet address, unstructured data combined with an Ethernet address, or an explicitly indicated data compression algorithm.

For example, the type of the data packet header may be indicated by "IPv4+Ethernet", "IPv6+Ethernet", "IPv4v6+ Ethernet", "Unstructured data (Unstructured data)+Ethernet", or another indication, for example, explicitly indicating whether the data compression algorithm is "the service uses a UDC compression algorithm", where the explicit indication may be performed by using 0 or 1.

If the type of the data packet header is identified by using the flow flow as the granularity, the type of the data packet header includes any one of the following: an IP address, an Ethernet address, an IP address combined with an Ethernet address, unstructured data combined with an Ethernet address, or an explicitly indicated data compression algorithm.

For example, a type of a data packet header of a quality of service (QoS for short) flow is configured to be one or more of IPv4, IPv6, IPv4v6, Ethernet, Unstructured data. IPv4+Ethernet, IPv6+Ethernet, IPv4v6+Ethernet, or Unstructured data+Ethernet.

Certainly, the foregoing two indication manners may be used separately or may be used together.

For example, one session includes three QoS flows: a flow A/flow B/flow C. During configuration, the base station may be indicated that: A type of a session-level data packet header is IPv4, and a type of a data packet header of the flow B is IPv6+Ethernet. In this way, the base station considers that types of data packet headers of the flow A and the flow C are IPv4, and the type of the data packet header of the flow B is IPv6+Ethernet.

It should be noted that UDC has an original meaning of uplink data compression, and resolves a problem of limited uplink coverage. In this embodiment of this application, because the UDC is used in an industrial control scenario, a corresponding compression algorithm may be used for both uplink data and downlink data. During configuration, types of an uplink data packet header and a downlink data packet header can be configured uniform, or types of an uplink data packet header and a downlink data packet header can be configured separately. For a manner of uniform configuration, only one type of data packet header is indicated to the base station, and the base station considers that the types of the uplink data packet header and the downlink data packet header are both the configured type. For a manner of separate configuration, the type of the uplink data packet header and the type of the downlink data packet header need to be indicated to the base station.

The foregoing indication manner may be used together in uplink and downlink. For example, a type of a data packet header may be configured based on a session in uplink, and a type of a data packet header may be configured based on a QoS flow in downlink, or there may be another combination manner. Details are not described herein again.

In this embodiment of this application, an upper-level node indicates the type of the data packet header to the base station. After receiving the indication, the base station may configure the indicated UDC-based algorithm for the data bearer/flow, and the UDC-based algorithm may be combined with an existing system. When a conventional compression algorithm needs to be used, using the conventional compression algorithm may be indicated. When the UDC-based algorithm needs to be used, using the UDC-based algorithm may be indicated. This improves system flexibility.

Certainly, in addition to the UDC-based algorithm described in this embodiment of this application, another algorithm may also be indicated to be used. If a default algorithm is required to be used for compression, no indication may be given herein, and an algorithm such as the UDC-based algorithm is directly used by default for compression.

In a possible implementation, to better suit a periodic feature of a service in the industrial private network and further improve system work efficiency in this embodiment of this application, a UDC buffer may be centrally updated after data processing in one cycle is completed.

In a current technology, based on a conventional manner of UDC, each time a terminal serving as a data compression device obtains a packet, a checksum is generated based on a UDC buffer status in a memory, then the packet is compressed, and the checksum is attached to the compressed packet. The data compression device usually updates the memory in two manners: One manner is to compress a segment in the data packet, update the memory, then compress a segment, and update the memory, and the other manner is to compress the entire packet before updating the memory. After receiving the data packet as the data decompression device, the PLC first generates a checksum based on an original memory status of the PLC and compares the checksum with a checksum carried in the received data packet. If the checksums are the same, the PLC decompresses the data packet and updates its own memory.

However, in industrial control, for a periodic service, the base station may indicate the terminal to store a to-be-stored data packet that needs to be stored in a memory in one cycle to enable the terminal to store the to-be-stored data packet in the memory when sending all data packets in the cycle. The PLC performs a check after receiving all the data packets sent in the cycle, and stores the to-be-stored data packet in the memory when the check succeeds.

That is, in this case, a UDC buffer in the memory may be updated once for one or more data packets in a same cycle. In other words, the sender sequentially generates checksums for a plurality of packets in a same cycle, compresses the packets, and stores the packets in the memory. After receiving all packets within one cycle, the receiver sequentially checks the checksums in the data packets. If the checksums are correct, the receiver decompresses the packets and stores the packets in its own memory.

Optionally, the base station may send control plane signaling to the terminal for indication, or may perform indication by using another existing signaling or construct new signaling for indication. This is not limited in this embodiment of this application.

The base station may indicate that the to-be-stored data packet stored in the memory may be some data packets or all data packets. When all data packets need to be stored, the base station may not perform indication. All data packets are stored by default. When storing some data packets is indicated, the sender and the receiver store only some data packets in the memory to calculate a checksum for a subsequent data packet, and perform a check after a cycle ends. For example, the base station may notify the terminal to store the first data packet in each cycle in the memory, and another data packet does not need to be stored in the memory.

It should be noted that the foregoing mainly describes a downlink process of the data packet, and the processing manner may also be used for an uplink data packet. In this case, the terminal may notify the base station of the data packet that needs to be stored in the memory. For example, all data packets are stored or the first data packet of each cycle is stored in the memory, and other data is not stored in the memory.

A batch of packets in a same cycle is processed in a unified manner, and this can avoid frequent reading and writing of the UDC buffer in the memory, reduce a quantity of times of reading and writing, prolong memory service life, and improve system work efficiency.

Figure 6:
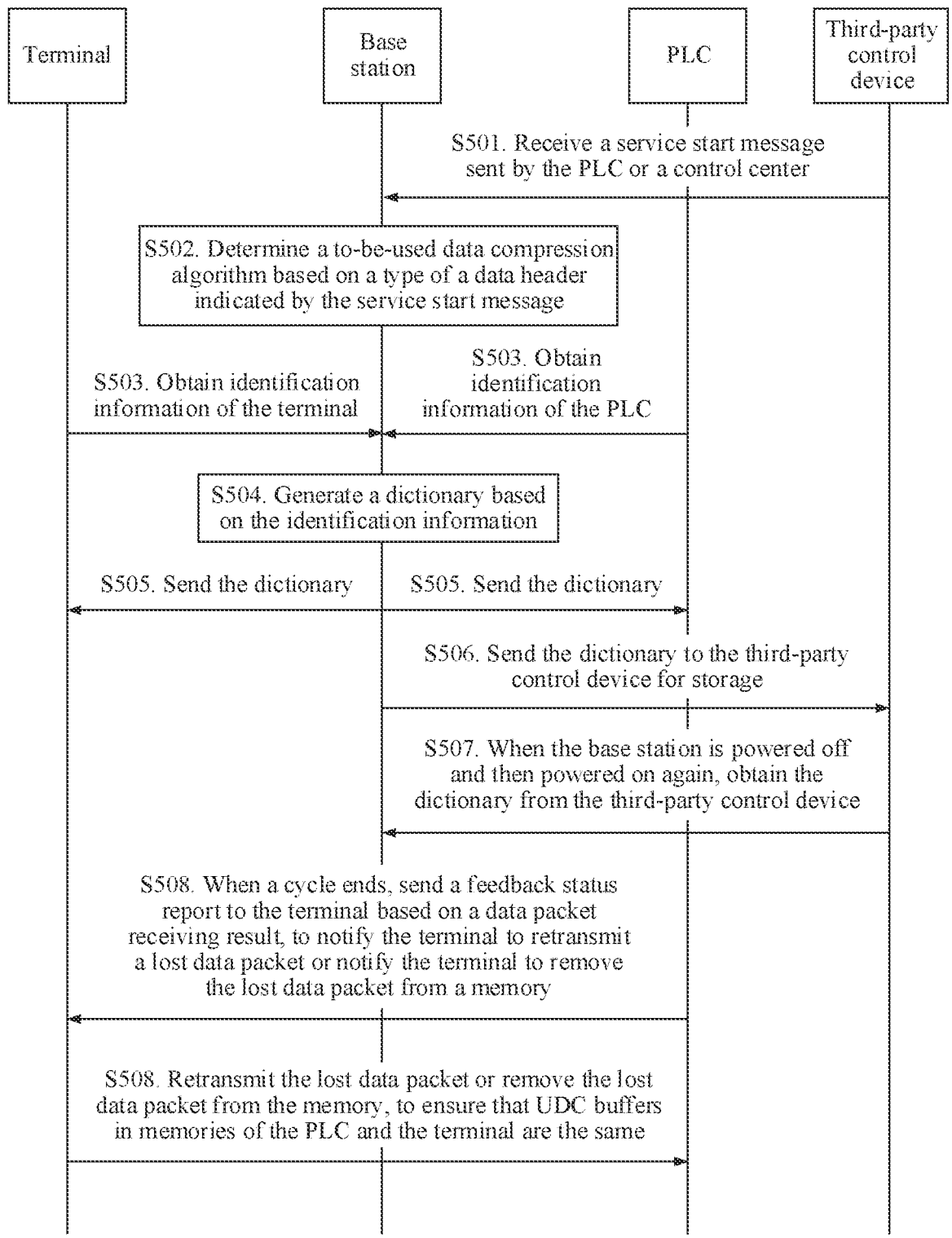
FIG. 6 is a schematic flowchart of yet another data compression method according to an embodiment of this application.

FIG. 6 is a schematic flowchart of still another data compression method according to an embodiment of this application. In this embodiment, steps S501 to S507 are the same as steps S401 to S407 and, after S507, the method further includes the following steps:

S508. When a cycle ends, the PLC sends a feedback status report to the terminal based on a data packet receiving result to notify the terminal to retransmit a lost data packet or notify the terminal to remove a lost data packet from a memory.

Alternatively, sending a feedback status report at the end of a plurality of preset cycles may be selected.

S509. The terminal retransmits the lost data packet or removes the lost data packet from the memory to ensure that the UDC buffers in the memories of the PLC and the terminal are the same.

Optionally, the feedback status report may include a radio link control (RLC for short) status report, a data convergence protocol (Packet Data Convergence Protocol, PDCP for short) status report, a feedback at a MAC layer, or the like. For example, the feedback report is the RLC status report. Because a delay requirement for industrial control is strict, a packet retransmitted by an RLC layer is not useful at an application layer. Therefore, the industrial control usually uses an RLC UM mode, but the use of the RLC UM mode does not ensure that every packet is received correctly. If a packet is not correctly received, the lost data packet cannot be stored in the memory. As a result, content stored in the memory of the sender and content stored in the memory of the receiver are inconsistent, affecting a UDC check of a subsequent data packet. Therefore, in this embodiment of this application, at the end of each cycle, the receiver may send an RLC status report to the sender to notify the sender that "not all data packets are received in this cycle" (where the prerequisite is that the receiver knows how many data packets are transmitted in the cycle, which may be a Boolean parameter) or "how many data packets are received in this cycle" (which may be a number), or "which data packets are received in this cycle" (which may be a bitmap or in another format). If packet loss occurs, the sender retransmits all packets within the cycle or only the lost packet. After receiving the retransmitted packets, the receiver decompresses the retransmitted packets and stores the retransmitted packets sequentially in the local UDC buffer. In this way, content in the UDC buffer of the sender and content in the UDC buffer of the receiver are consistent. When data of a next cycle is received, the check can be performed normally. In this process, the retransmitted packets are only used to update the UDC buffer of the receiver and are not delivered to the application layer. These packets may be transmitted to the receiver before the new data in the next cycle arrives.

When the feedback status report is a PDCP status report, for example, the receiver may notify the sender by using a Media Access Control (MAC for short) customer device (Customer Edge, CE for short) that: "Not all data packets are received in this cycle", "a quantity of data packets that are received in this cycle", or "which data packets are received in this cycle". When the feedback status packet is a hybrid automatic repeat request (HARQ for short) feedback at a MAC layer, for example, for each transport block, the receiver sends a HARQ feedback to notify the sender whether the receiver receives the HARQ feedback. If the sender finds that the receiver does not correctly receive a transport block, the sender retransmits the transport block. After receiving the retransmitted transport block, the receiver updates the UDC buffer of the receiver and does not deliver the data packets to the application layer.

Optionally, in addition to being indicated to retransmit the lost packet to ensure that the content in the UDC buffer of the sender and the content in the UDC buffer of the receiver are consistent, the sender may be further notified of which packets are not correctly received. In this way, the sender does not need to put the lost packet into its own UDC buffer, and packets that are already put in the buffer can be deleted. The same can be achieved in this way.

Optionally, the feedback of the receiver may be the following.

"Not all data packets are received in this cycle." In this case, the sender does not write all data packets in the cycle in the UDC buffer, and may delete a data packet that has been written.

"Data packets received in the current cycle". In this case, if the receiver feeds back packets that are not received, the sender does not place these packets in its own UDC buffer and may delete a data packet that has been written.

In the foregoing manner, that the UDC buffers of the data sender and receiver are consistent can be ensured. This ensures that data compression works properly.

It should be noted that sequence numbers of the foregoing processes do not mean execution sequences in the embodiments in FIG. 2 to FIG. 5 of this application. The execution sequences of the processes should be determined based on functions and internal logic of the processes, and shall not constitute any limitation on the implementation processes of the embodiments of this application. Steps different from those in other embodiments in some embodiments may be performed independently, or may be combined with steps in other embodiments.

Figure 7:
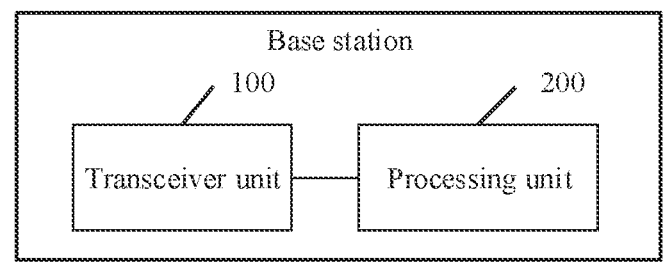
FIG. 7 is a schematic composition diagram of a base station according to an embodiment of this application.

FIG. 7 is a schematic composition diagram of a base station according to an embodiment of this application. The base station may include:

a transceiver unit 100, configured to obtain identification information of a data compression device and/or a data decompression device; and a processing unit 200, configured to generate a dictionary based on the identification information, where the transceiver unit 100 is further configured to: send the dictionary to the data compression device and the data decompression device to enable the data compression device and the data decompression device to perform data compression and data transmission based on the received dictionary.

Optionally, the transceiver unit 100 is further configured to:

send the dictionary to a third-party control device for storage; and when the base station is powered off and then powered on again, obtain the dictionary from the third-party control device.

Optionally, the transceiver unit 100 is further configured to:

receive a service start message sent by the data decompression device or a third-party control device; and the processing unit is further configured to:

determine a to-be-used data compression algorithm based on a type of a data packet header indicated by the service start message, where the data compression algorithm includes an algorithm that is based on uplink data transmission UDC.

Optionally, the type of the data packet header is identified by using a data bearer as a granularity and/or identified by using a flow flow as a granularity.

If the type of the data packet header is identified by using the data bearer as the granularity, the type of the data packet header includes any one of the following: an IP address combined with an Ethernet address, unstructured data combined with an Ethernet address, or an explicitly indicated data compression algorithm.

If the type of the data packet header is identified by using the flow flow as the granularity, the type of data packet header includes any one of the following: an IP address, an Ethernet address, an IP address combined with an Ethernet address, unstructured data combined with an Ethernet address, or an explicitly indicated data compression algorithm.

Optionally, for a periodic service, the transceiver unit 100 is further configured to: indicate the data compression device to store a to-be-stored data packet that needs to be stored in a memory in one cycle to the data compression device to store the to-be-stored data packet in the memory when sending all data packets in the cycle; and perform a check after receiving all the data packets sent in the cycle, and store the to-be-stored data packet in the memory when the check succeeds.

Optionally, for a periodic service, when one or more cycles end, the data decompression device sends a feedback status report to the data compression device based on a result of data packet receiving; and notifies the data compression device to retransmit a lost data packet or notifies the data compression device to move the lost data packet out of the memory to ensure that UDC buffers in memories of the data decompression device and the data compression device are the same.

Optionally, the identification information includes at least one of the following:

an Ethernet address, an IP address, port information, or a virtual local area network identifier.

Optionally, the identification information further includes an application layer command sent by the data decompression device to the data compression device.

Optionally, the dictionary includes a first dictionary used by the terminal and a second dictionary used by the PLC.

The first dictionary is different from the second dictionary.

Optionally, a quantity of terminals is greater than or equal to one. When the quantity of terminals is greater than one, the base station generates an independent dictionary for each terminal. Alternatively, the base station generates an independent dictionary for terminals in a same workgroup.

For concepts, explanations, detailed descriptions, and other steps of the base station that are related to the technical solutions provided in this embodiment of this application, refer to the descriptions of the content in the foregoing method embodiments. Details are not described herein again.

Figure 8:
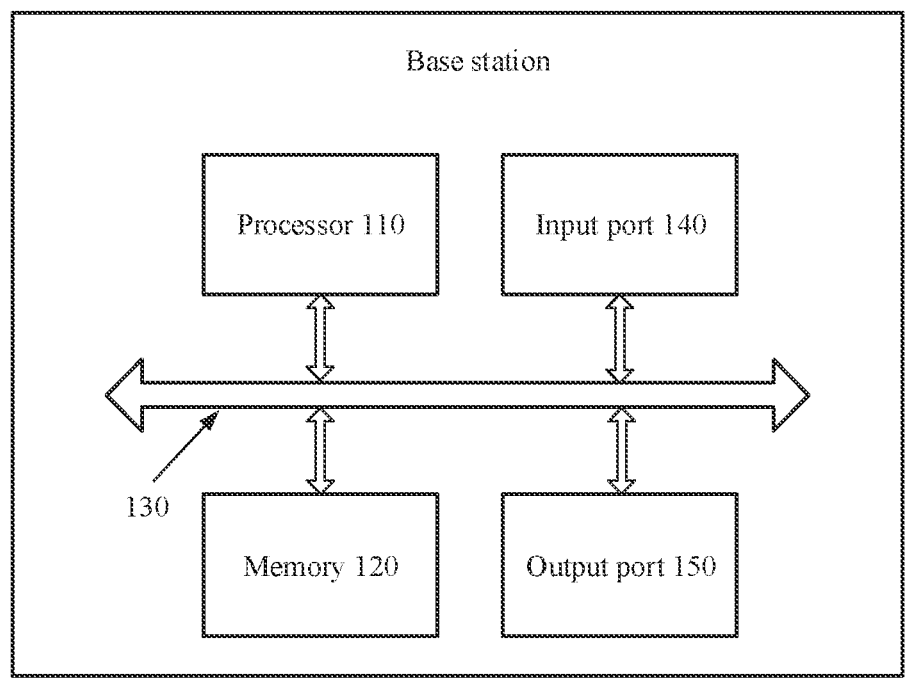
FIG. 8 is a schematic composition diagram of a base station according to an embodiment of this application.

FIG. 8 is a schematic composition diagram of another base station according to an embodiment of this application. As shown in FIG. 7, the base station may include a processor 110, a memory 120, and a bus 130. The processor 110 is connected to the memory 120 through the bus 130. The memory 120 is configured to store instructions. The processor 110 is configured to execute the instructions stored in the memory 120 to implement the steps in the methods corresponding to FIG. 2 to FIG. 5.

Further, the base station may further include an input port 140 and an output port 150. The processor 110, the memory 120, the input port 140, and the output port 150 may be connected through the bus 130.

The processor 110 is configured to execute the instruction stored in the memory 120 to control the input port 140 to receive a signal, control the output port 150 to send a signal, and complete the steps performed by the apparatus in the foregoing methods. The input port 140 and the output port 150 may be a same physical entity or different physical entities. When the input port 140 and the output port 150 are the same physical entity, the input port 140 and the output port 150 may be collectively referred to as an input/output port. The memory 120 may be integrated into the processor 110, or may be disposed separately from the processor 110.

In an implementation, it may be considered that functions of the input port 140 and the output port 150 are implemented by using a transceiver circuit or a dedicated transceiver chip. It may be considered that the processor 110 is implemented by using a dedicated processing chip, a processing circuit, a processor, or a general-purpose chip.

In another implementation, it may be considered that the base station provided in this embodiment of this application is implemented by using a general-purpose computer. To be specific, program code that is used to implement functions of the processor 110, the input port 140, and the output port 150 is stored in the memory, and a general-purpose processor implements the functions of the processor 110, the input port 140, and the output port 150 by executing the code in the memory.

For concepts, explanations, detailed descriptions, and other steps of the base station that are related to the technical solutions provided in this embodiment of this application, refer to the descriptions of the content in the foregoing methods or other embodiments. Details are not described herein again.

A person skilled in the art may understand that for ease of description, FIG. 8 shows only one memory and one processor. Actually, a controller may include a plurality of processors and a plurality of memories. The memory may also be referred to as a storage medium, a storage device, or the like. This is not limited in the embodiments of this application.

It should be understood that, in the embodiments of this application, the processor may be a central processing unit ("CPU" for short), or may be another general purpose processor, a digital signal processor ("DSP" for short), an application-specific integrated circuit ("ASIC" for short), a field programmable gate array ("FPGA" for short), or another programmable logical device, discrete gate or transistor logical device, discrete hardware component, or the like.

The memory may include a read-only memory and a random access memory, and provide instructions and data to the processor. A part of the memory may further include a non-volatile random access memory.

The bus may further include a power bus, a control bus, a status signal bus, and the like, in addition to a data bus. However, for clear description, various types of buses in the figure are marked as the bus.

In an implementation process, steps in the foregoing methods can be implemented by using a hardware integrated logical circuit in the processor, or by using instructions in a form of software. The steps of the method disclosed with reference to the embodiments of this application may be directly performed by a hardware processor, or may be performed by using a combination of hardware in the processor and a software module. A software module may be located in a mature storage medium in the art, such as a random access memory, a flash memory, a read-only memory, a programmable read-only memory, an electrically erasable programmable memory, or a register. The storage medium is located in the memory, and a processor reads information in the memory and completes the steps in the foregoing methods in combination with hardware of the processor. To avoid repetition, details are not described herein again.

According to the method provided in the embodiments of this application, the embodiments of this application further provide a system, including the foregoing base station, terminal, PLC, third-party control device, and the like.

Sequence numbers of the foregoing processes do not mean execution sequences in various embodiments of this application. The execution sequences of the processes should be determined based on functions and internal logic of the processes and shall not constitute any limitation on the implementation processes of the embodiments of this application.

A person of ordinary skill in the art may be aware that, in combination with illustrative logical blocks ("ILB" for short) described in the embodiments disclosed in this specification and steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to some embodiments of this application are all or partially generated. The computer may be a general-purpose computer, a dedicated computer, a computer network, or other programmable apparatuses. The computer instructions may be stored in the computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive), or the like.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A data compression method, comprising:
    obtaining, by a base station, identification information of at least one of a data compression device or a data decompression device;
    generating a dictionary based on the identification information;
    sending the dictionary to the data compression device and the data decompression device to enable the data compression device and the data decompression device to perform data compression and data transmission based on the dictionary;
    sending the dictionary to a control device for storage; and
    when the base station is powered off and then powered on again, obtaining the dictionary from the control device.

2. The method according to claim 1, wherein the control device is a third-party control device.

3. The method according to claim 1, wherein before the obtaining, by a base station, identification information of at least one of a data compression device or a data decompression device, the method further comprises:
    receiving, by the base station, a service start message sent by the data decompression device or a third-party control device; and
    determining a to-be-used data compression algorithm based on a type of a data packet header indicated by the service start message, wherein the to-be-used data compression algorithm comprises an algorithm that is based on uplink data transmission (UDC).

4. The method according to claim 3, wherein the type of the data packet header is identified by using a data bearer as a granularity or identified by using a flow as a granularity.

5. The method according to claim 1, wherein the method further comprises:
    for a periodic service, indicating, by the base station, the data compression device to store a to-be-stored data packet that needs to be stored in a memory in one cycle, wherein the data compression device is enabled to store the to-be-stored data packet in the memory when sending all data packets in the cycle;
    performing, by the data decompression device, a check after receiving all the data packets sent in the cycle; and
    storing the to-be-stored data packet in the memory when the check succeeds.

6. The method according to claim 1, wherein for a periodic service, when one or more cycles end, the data decompression device sends a feedback status report to the data compression device based on a result of data packet receiving, and wherein the data decompression device notifies the data compression device to retransmit a lost data packet or notifies the data compression device to move the lost data packet out of a memory to ensure that UDC buffers in memories of the data decompression device and the data compression device are the same.

7. The method according to claim 1, wherein the identification information comprises at least one of an Ethernet address, an IP address, port information, or a virtual local area network identifier.

8. The method according to claim 1, wherein the identification information further comprises an application layer command sent by the data decompression device to the data compression device.

9. A base station, comprising:
    a transceiver;
    at least one processor; and
    one or more memories coupled to the at least one processor and storing programming instructions for execution by the at least one processor to:
        obtain, by the transceiver, identification information of at least one of a data compression device or a data decompression device;
        generate a dictionary based on the identification information;
        send the dictionary to the data compression device and the data decompression device to enable the data compression device and the data decompression device to perform data compression and data transmission based on the dictionary;
        send the dictionary to a control device for storage; and
        when the base station is powered off and then powered on again, obtain the dictionary from the control device.

10. The base station according to claim 9, wherein the control device is a third-party control device.

11. The base station according to claim 9, wherein the programming instructions are for execution by the at least one processor to:
    receive a service start message sent by the data decompression device or a third-party control device; and
    determine a to-be-used data compression algorithm based on a type of a data packet header indicated by the service start message, wherein the to-be-used data compression algorithm comprises an algorithm that is based on uplink data transmission (UDC).

12. The base station according to claim 11, wherein the type of the data packet header is identified by using a data bearer as a granularity or identified by using a flow as a granularity.

13. The base station according to claim 9, wherein the programming instructions are for execution by the at least one processor to:
    for a periodic service, indicate the data compression device to store a to-be-stored data packet that needs to be stored in a first memory in one cycle, wherein the data compression device is enabled to store the to-be-stored data packet in the first memory when sending all data packets in the cycle;
    perform a check after receiving all the data packets sent in the cycle; and
    store the to-be-stored data packet in the first memory when the check succeeds.

14. The base station according to claim 9, wherein for a periodic service, when one or more cycles end, the data decompression device sends a feedback status report to the data compression device based on a result of data packet receiving, and wherein the data decompression device notifies the data compression device to retransmit a lost data packet or notifies the data compression device to move the lost data packet out of a first memory to ensure that UDC buffers in memories of the data decompression device and the data compression device are the same.

15. The base station according to claim 9, wherein the identification information comprises at least one of an Ethernet address, an IP address, port information, or a virtual local area network identifier.

16. The base station according to claim 9, wherein the identification information further comprises an application layer command sent by the data decompression device to the data compression device.

17. A non-transitory computer-readable storage medium storing programming instructions for execution by at least one processor to:

obtain identification information of at least one of a data compression device or a data decompression device;

generate a dictionary based on the identification information;

send the dictionary to the data compression device and the data decompression device to enable the data compression device and the data decompression device to perform data compression and data transmission based on the dictionary;

send the dictionary to a control device for storage; and when a base station is powered off and then powered on again, obtain the dictionary from the control device.

18. The non-transitory computer-readable storage medium according to claim 17, wherein the control device is a third-party control device.

19. The non-transitory computer-readable storage medium according to claim 17, wherein the programming instructions are for execution by the at least one processor to:

receive a service start message sent by the data decompression device or a third-party control device; and determine a to-be-used data compression algorithm based on a type of a data packet header indicated by the service start message, wherein the to-be-used data compression algorithm comprises an algorithm that is based on uplink data transmission (UDC).

20. The non-transitory computer-readable storage medium according to claim 19, wherein the type of the data packet header is identified by using a data bearer as a granularity or identified by using a flow as a granularity.

* * * * *